United States Patent
Ebina

(10) Patent No.: US 6,693,329 B2
(45) Date of Patent: Feb. 17, 2004

(54) SEMICONDUCTOR DEVICES HAVING A FIELD EFFECT TRANSISTOR AND A BI-POLAR TRANSISTOR

(75) Inventor: Akihiko Ebina, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/050,792

(22) Filed: Jan. 18, 2002

(65) Prior Publication Data

US 2002/0153575 A1 Oct. 24, 2002

(30) Foreign Application Priority Data

Jan. 19, 2001 (JP) ........................................ 2001-011858

(51) Int. Cl.[7] .................... H01L 27/01; H01L 27/082
(52) U.S. Cl. ........................................ 257/350; 257/577
(58) Field of Search .................................. 257/347, 350, 257/574, 577

(56) References Cited

U.S. PATENT DOCUMENTS

| | | | |
|---|---|---|---|
| 5,240,865 A | 8/1993 | Malhi | 438/135 |
| 5,459,083 A * | 10/1995 | Subrahmanyan et al. | 438/236 |
| 5,552,624 A * | 9/1996 | Skotnicki et al. | 257/350 |
| 5,998,854 A | 12/1999 | Morishita et al. | 257/565 |
| 6,137,146 A | 10/2000 | Manning | 257/378 |
| 6,225,664 B1 * | 5/2001 | Endo et al. | 257/347 |
| 6,232,649 B1 * | 5/2001 | Lee | 257/588 |
| 6,246,104 B1 | 6/2001 | Tsuda et al. | 257/558 |
| 6,268,630 B1 | 7/2001 | Schwank et al. | 257/347 |
| 2002/0130409 A1 | 9/2002 | Oue et al. | 257/720 |

FOREIGN PATENT DOCUMENTS

| | | | |
|---|---|---|---|
| JP | 3-62-128561 | * 6/1987 | ................. 257/577 |
| JP | 05-041488 | 2/1993 | |
| JP | 05-218316 | 8/1993 | |
| JP | 11-204801 | 7/1999 | |
| JP | 2001-007332 | 1/2001 | |
| JP | 2001-007333 | 1/2001 | |

OTHER PUBLICATIONS

Parke et al., Bipolar–FET Hybrid–Mode Operation of Quarter–Micrometer SOI MOSFETs, May 1993, IEEE, Electron Device Letters, vol. 14, No. 5, pp. 234–236.*

U.S. Application Ser. No. 10/050,793, filed Jan. 18, 2002, having U.S. patent application Pub. No. US2002/0113266 A1, published Aug. 22, 2002.

U.S. Application Ser. No. 10/014,612, filed Dec. 14, 2001, having U.S. patent application Pub. No. US2002/0117721 A1, published Aug. 29, 2002.

Notice of Reasons of Rejection for Japanese Patent Application No. 2001–011858 (from which priority is claimed in U.S. Ser. No. 10/050,792), which cites JP05/041488 and JP05–218316.

Wolf, Stanley, *Silicon Processing for the VLSI Era*; Lattice Press, 1990, vol. 2, pp. 557–558.

Zheng et al., "SOI bipolar–MOS merges transistors for BiCMOS appilcation", *Electronics Letters*, vol. 35, Issue 14, Jul. 8, 1999 pp. 1203–1204.

(List continued on next page.)

*Primary Examiner*—George Eckert
(74) *Attorney, Agent, or Firm*—Konrad Raynes Victor & Mann, LLP; Alan S. Raynes

(57) ABSTRACT

A semiconductor device may include an element isolation region 14, an npn-type bipolar transistor 200, and a p-type field effect transistor 100, which are formed on a SOI substrate. The bi-polar transistor 200 and the field effect transistor 100 are formed in the same element forming region 16. An n-type body region 52a is electrically connected to an n-type collector region 230. A p-type source region 210 is electrically connected to the n-type collector region 230. A p-type drain region 130 is electrically connected to a p-type base region 220.

9 Claims, 16 Drawing Sheets

OTHER PUBLICATIONS

Notice of Reasons of Rejection for Japanese Patent Application No. 2001–011859 (from which priority is claimed in U.S. patent application Ser. No. 10/050,793), and which cites JP05–041488 and JP05–218316, which were previously cited in an IDS.

Notice of Reasons of Rejection for Japanese Patent Application No. 2000–382395 (from which priority is claimed in U.S. patent application Ser. No. 10/014,612), and which cites JP05–041488 and JP05–218316, which were previously cited in an IDS.

* cited by examiner

SEMICONDUCTOR DEVICES HAVING A FIELD EFFECT TRANSISTOR AND A BI-POLAR TRANSISTOR

Applicant hereby incorporates by reference Japanese Application No. 2001-011858, filed Jan. 19, 2001, in its entirety. Applicant hereby incorporates by reference U.S. patent application Ser. No. 10/050,793, filed on Jan. 18, 2002, in its entirety.

TECHNICAL FIELD

The present invention includes semiconductor devices having a field effect transistor and a bi-polar transistor, and methods for manufacturing the same.

RELATED ART

A MOS field effect transistor with an SOI (Silicon-on-Insulator) structure can be driven at a low power consumption and at a higher speed compared to an ordinary MOS field effect transistor.

FIG. 16 schematically shows one example of a MOS field effect transistor with an SOI structure. An embedded oxide film 1100 that is formed from a silicon oxide film is formed on a silicon substrate 2000. A source region 1200 and a drain region 1300 are formed on the embedded oxide film 1100. A body region 1400 is formed on the embedded oxide film 1100 and between the source region 1200 and the drain region 1300. A gate electrode 1500 is formed over the body region 1400 through a gate dielectric layer.

It is noted that the body region 1400 of the MOS field effect transistor is in a floating state. Accordingly, carriers that are generated by an impact ionization phenomenon are stored in the body region 1400. When carriers are stored in the body region 1400, the potential of the body region 1400 changes. A phenomenon that is a so-called substrate floating effect takes place. When the substrate floating effect occurs, a kink phenomenon and a history effect occur in the MOS field effect transistor.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
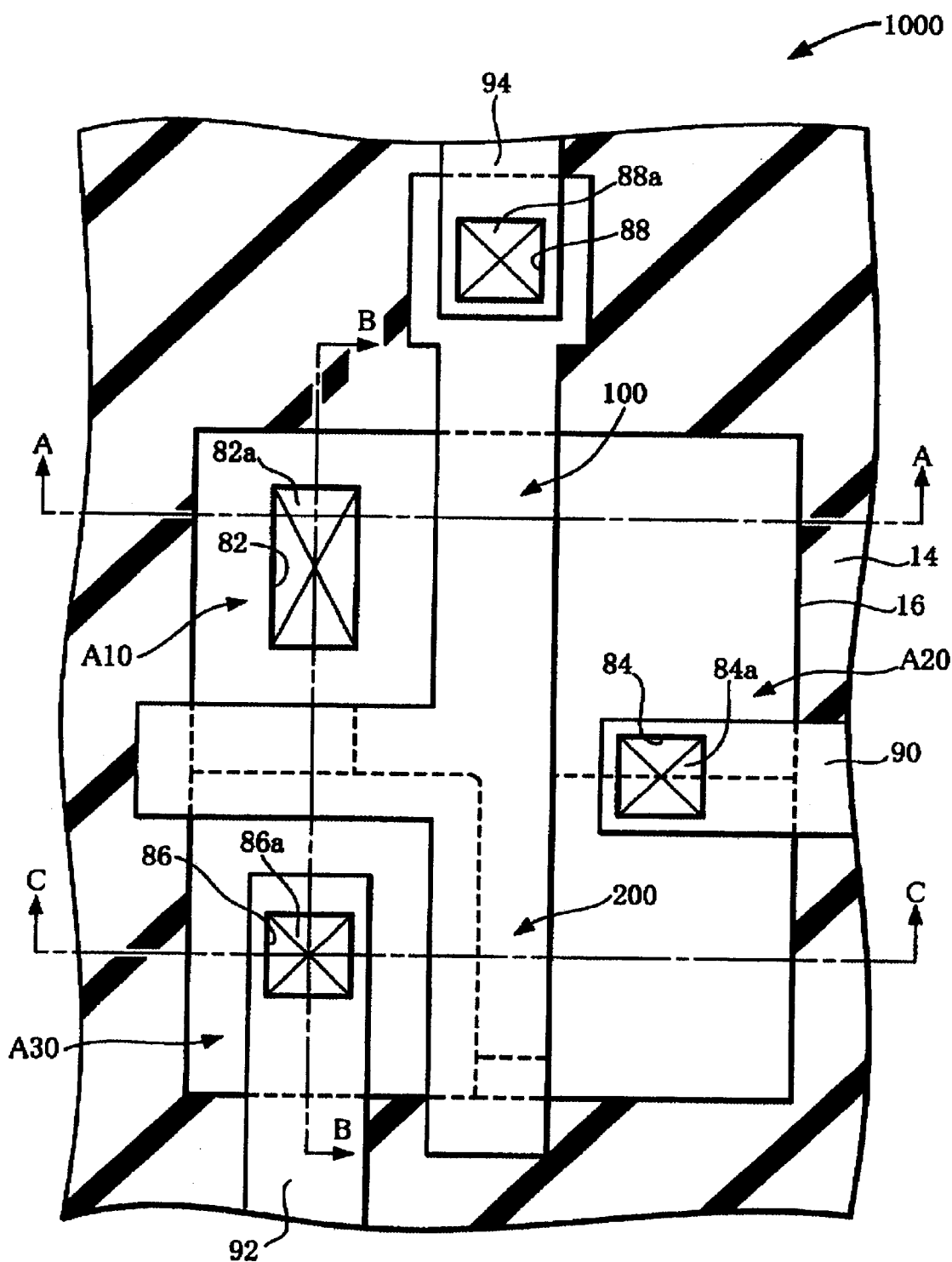
FIG. 1 schematically shows a plan view of a semiconductor device in accordance with an embodiment of the present invention.

It is an object of certain embodiments of the present invention to provide semiconductor devices that suppresses the substrate floating effect and methods for manufacturing the same.

A first semiconductor device in accordance with certain embodiments of the present invention comprises:

an insulation layer;

a semiconductor layer formed on the insulation layer;

an element isolation region formed in the semiconductor layer;

element forming regions defined by the element isolation region; and a bi-polar transistor and a field effect transistor in at least one of the element forming regions;

wherein the bi-polar transistor includes an emitter region of a first conduction type, a base region of a second conduction type, and a collector region of the first conduction type, the field effect transistor includes a gate electrode layer, a source region of the second conduction type, and a drain region of the second conduction type, and further includes a first conduction type body region formed at least between the source region and the drain region;

wherein the first conduction type body region is electrically connected to the collector region, the source region is electrically connected to the collector region, and the drain region is electrically connected to the base region.

In accordance with the embodiment described above, the substrate floating effect may be prevented or inhibited from occurring. In other words, changes in the threshold voltage, and occurrence of kink and history effects can be suppressed.

The first semiconductor device of the present invention described above may also include the following embodiments (1) and (2).

(1) The embodiment may further comprise:
a first electrode layer having one end section that continues to a side section of the gate electrode layer and another end section that reaches the element isolation region,
wherein the gate electrode layer is formed in a manner to cross over the element forming region,
the drain region is formed in a first region surrounded by the gate electrode layer in the field effect transistor forming region, the first electrode layer, and the element isolation region,
the source region and the collector region are formed in a second region surrounded by the gate electrode layer and the element isolation region,
the emitter region is formed in a third region surrounded by the gate electrode layer in the bi-polar transistor forming region, the first electrode layer and the element isolation region, and the first conduction type body region is formed below the gate electrode layer.

(2) The embodiment may further comprise:
a first layer and a second layer, wherein
the first layer has one end section continuing to the gate electrode layer or the second layer, and another end section reaching the element isolation region,
the second layer has one end section continuing to the gate electrode layer or the first layer, and another end section reaching the element isolation region,
the drain region is formed in a first region surrounded by the gate electrode layer, the first layer and the element isolation region,
the source region is formed in a second region surrounded by the gate electrode layer, the second layer and the element isolation region,
the collector region is formed in a part of the semiconductor layer in the second region,
the emitter region is formed in a third region surrounded by the first layer, the second layer and the element isolation region,
the base region is formed below a part of the first layer, and in the semiconductor layer below a part of the second layer,
the first conduction type body region is formed in the semiconductor layer at least below the gate electrode layer and below a part of the second layer, and
a connection section for electrically connecting the base region and the drain region in the semiconductor layer below a part of the first layer.

Also, the first semiconductor device may include at least any one of the following embodiments (3) through (7).

(3) An embodiment wherein the connection section is a first body region of the second conduction type.

(4) An embodiment wherein a contact layer is formed for electrically connecting the source region and the collector region, wherein the contact layer is formed in a manner to cross over the source region and the collector region.

(5) An embodiment wherein a second body region of the second conduction type is formed in the semiconductor layer between the collector region and the emitter region, and in the semiconductor layer adjacent to the element isolation region.

(6) An embodiment wherein the first conduction type is n-type, and the second conduction type is p-type.

Alternatively, an embodiment wherein the first conduction type is p-type, and the second conduction type is n-type.

(7) An embodiment wherein the semiconductor layer is a silicon layer.

A second semiconductor device in accordance with certain embodiments of the present invention comprises:
an insulation layer;
a semiconductor layer formed on the insulation layer;
an element isolation region formed in the semiconductor layer;
element forming regions defined by the element isolation region; and
a bi-polar transistor and a field effect transistor in at least one of the element forming regions;
wherein a gate electrode layer is formed on the semiconductor layer,
the gate electrode layer is formed in a manner to cross over the element forming region,
a first electrode layer is formed on the semiconductor layer,
wherein the first electrode layer has one end section continuing to a side section of the gate electrode layer, and another end section reaching the element isolation region,
a first impurity diffusion layer of the second conduction type is formed in a first region surrounded by the gate electrode layer in the field effect transistor forming region, the first electrode layer and the element isolation region,
a second impurity diffusion layer of the second conduction type is formed in the field effect transistor forming region among a second region surrounded by the gate electrode layer and the element isolation region,
a first impurity diffusion layer of the first conduction type is formed in the second region in the bi-polar transistor forming region,
a second impurity diffusion layer of the first conduction type is formed in a third region surrounded by the gate electrode layer in the bi-polar transistor forming region, the first electrode layer and the element isolation region,
a first conduction type body region is formed below the gate electrode layer,
a third impurity diffusion layer of the second conduction type is formed below the gate electrode layer in the bi-polar transistor forming region and the first electrode layer and along a periphery of the second impurity diffusion layer of the first conduction type,
the first conduction type body region is electrically connected to the first impurity diffusion layer of the first conduction type, and
the second impurity diffusion layer of the second conduction type is electrically connected to the first impurity diffusion layer of the first conduction type, and
the first impurity diffusion layer of the second conduction type is electrically connected to the third impurity diffusion layer of the second conduction type.

In accordance with preferred embodiments, the substrate floating effect may be prevented or inhibited from occurring. In other words, changes in the threshold voltage, and occurrence of kink and history effects can be suppressed.

A first method for manufacturing a semiconductor device in accordance with certain embodiments of the present invention is pertinent to a method for manufacturing a semiconductor device including an insulation layer and a semiconductor layer formed on the insulation layer, the method comprising the steps of:

(A) forming an element isolation region in the semiconductor layer to define element forming regions; and (B) forming a field effect transistor and a bi-polar transistor in the same one of the element forming regions, wherein the step (B) comprises the steps of:

(B-1) forming a first conduction type body region at least in the semiconductor layer in a forming region where a gate electrode layer is to be formed;

(B-2) forming a first body region of a second conductivity type at least in a part of the semiconductor layer in a forming region where a first layer is to be formed;

(B-3) forming the gate electrode layer and the first electrode layer on the semiconductor layer, wherein the first electrode layer has one end section that continues to a side section of the gate electrode layer and another end section that reaches the element isolation region;

(B-4) forming an impurity diffusion layer of the second conduction type in the semiconductor layer in a third region surrounded by the gate electrode layer in the bi-polar transistor forming region, the first electrode layer and the element isolation region;

(B-5) conducting a thermal treatment to thermally diffuse the impurity diffusion layer of the second conduction type to form a base region of the bi-polar transistor below the gate electrode layer and below the first electrode layer in the semiconductor layer;

(B-6) forming a drain region of the second conduction type of the field effect transistor in a first region surrounded by the gate electrode layer of the field effect transistor, the first electrode layer and the element isolation region, wherein the drain region is electrically connected to the base region through the first body region of the second conduction type;

(B-7) forming a source region of the second conduction type of the field effect transistor in a part of a second region surrounded by the gate electrode layer and the element isolation region;

(B-8) forming a collector region of the first conduction type of the bi-polar transistor in a part of the second region, wherein the collector region is electrically connected to the first conduction type body region;

(B-9) forming an emitter region of the first conduction type of the bi-polar transistor in the third region; and (B-10) electrically connecting the source region and the collector region.

A second method for manufacturing a semiconductor device in accordance with certain embodiments of the present invention is pertains to a method for manufacturing a semiconductor device including an insulation layer and a semiconductor layer formed on the insulation layer, the method comprising the steps of:

(A) forming an element isolation region in the semiconductor layer to define element forming regions; and (B) forming a field effect transistor and a bi-polar transistor in the same one of the element forming regions, wherein the step (B) comprises the steps of:

(B-1) forming a first conduction type body region in the semiconductor layer at least in a forming region where a gate electrode layer is to be formed and in a forming region where a second layer is to be formed;

(B-2) forming a first body region of the second conductivity type at least in a part of the semiconductor layer in a forming region where a first layer is to be formed;

(B-3) forming a gate electrode layer on the semiconductor layer;

(B-4) forming a first layer on the semiconductor layer, wherein the first layer has one end section that continues to the gate electrode layer or the second layer and another end section that reaches the element isolation region;

(B-5) forming a second layer on the semiconductor layer, wherein the second layer has one end section that continues to the gate electrode layer or the first layer and another end section that reaches the element isolation region;

(B-6) forming an impurity diffusion layer of the second conduction type in the semiconductor layer in a third region surrounded by the first layer, the second layer and the element isolation region;

(B-7) conducting a thermal treatment to thermally diffuse the impurity diffusion layer of the second conduction type to form a base region of the second conduction type of the bi-polar transistor below the first layer and in the semiconductor layer below the second layer, (B-8) forming a drain region of the second conduction type of the field effect transistor in a first region surrounded by the gate electrode layer, the first layer and the element isolation region, wherein the drain region is electrically connected to the base region through the first body region of the second conduction type;

(B-9) forming a source region of the second conduction type of the field effect transistor at least in a part of a second region surrounded by the gate electrode layer, the second layer and the element isolation region;

(B-10) forming a collector region of the first conduction type of the bi-polar transistor in a part of a second region surrounded by the gate electrode layer, the second layer and the element isolation region, wherein the collector region of the first conduction type is electrically connected to the first conduction type body region;

(B-11) forming an emitter region of the first conduction type of the bi-polar transistor in a third region surrounded by the first layer, the second layer and the element isolation region; and (B-12) electrically connecting the source region and the collector region.

The second method for manufacturing a semiconductor device in accordance with certain embodiments of the present invention may further comprise the step of forming a second body region of the second conduction type in the semiconductor layer below the second layer in the element forming region, and in the semiconductor layer adjacent to the element isolation region.

The first and second methods described above for manufacturing a semiconductor device may further include at least the following embodiments.

(1) An embodiment wherein the first conduction type is n-type, and the second conduction type is p-type. Alternatively, an embodiment wherein the first conduction type is p-type, and the second conduction type is n-type.

(2) An embodiment wherein the semiconductor layer is a silicon layer.

Certain preferred embodiments of the present invention are described below with reference to the accompanying drawings.

Figure 2:
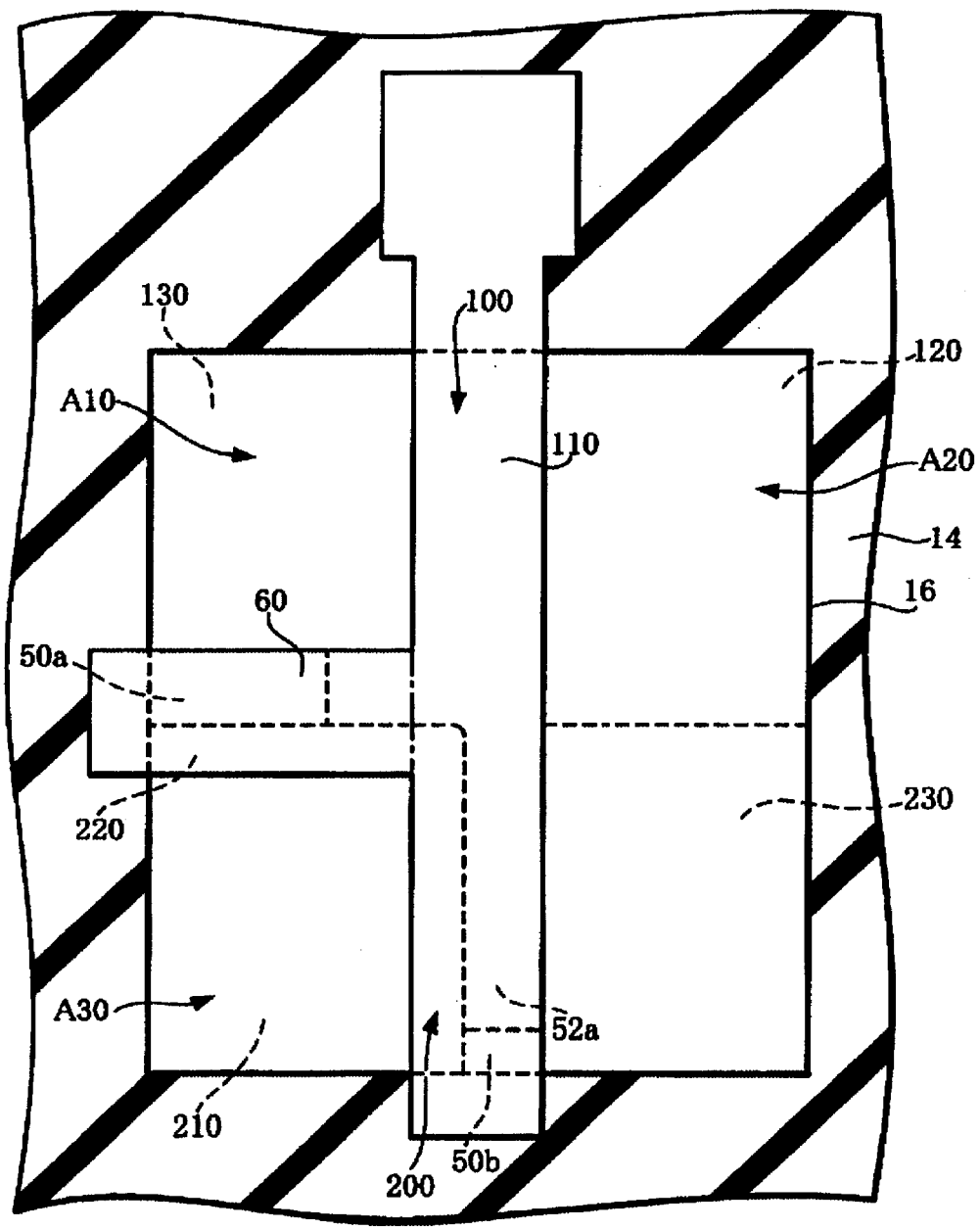
FIG. 2 schematically shows a plan view of a plane of the semiconductor device in a layer in which a gate electrode layer is formed and below that layer in accordance with an embodiment of the present invention.
Figure 3:
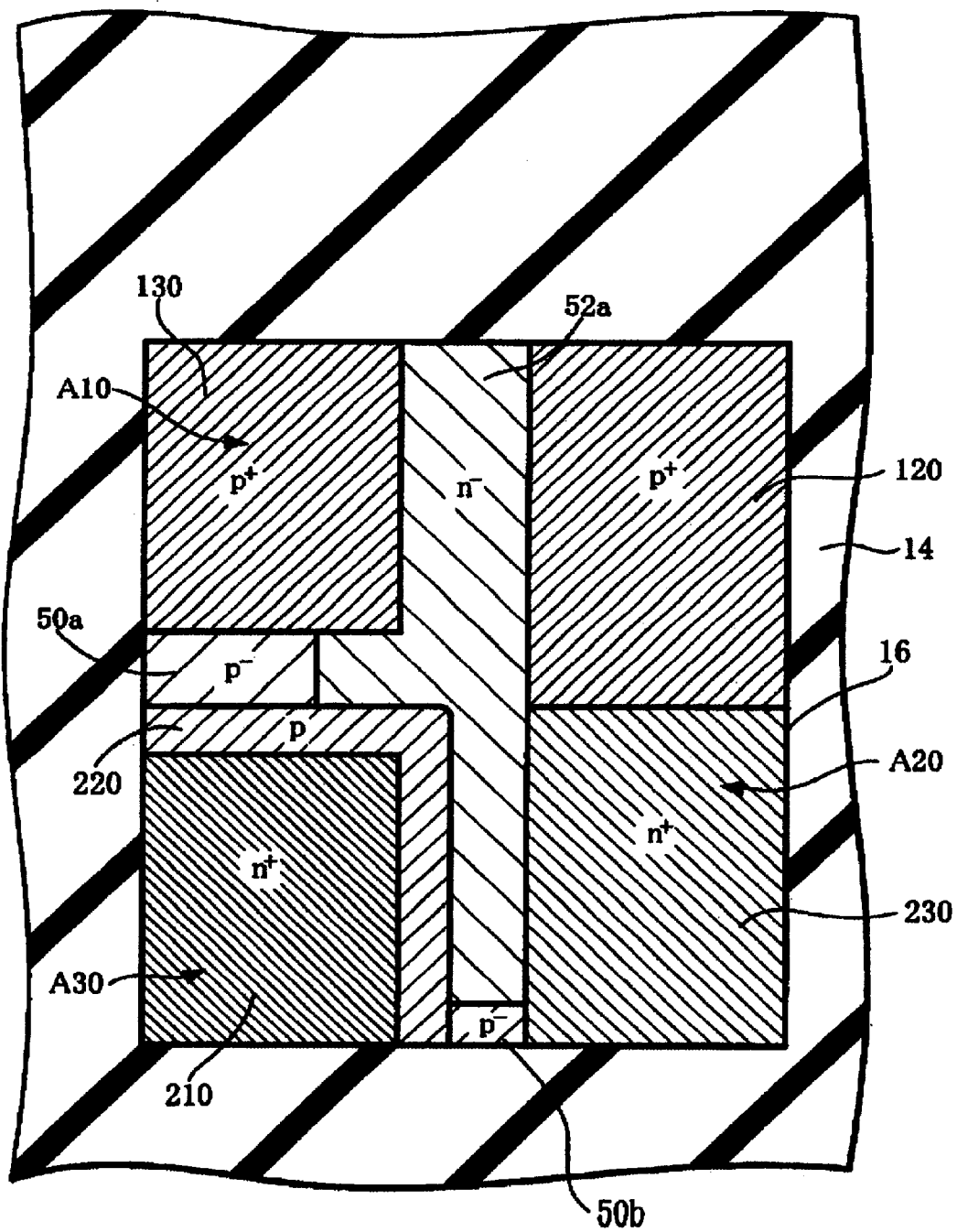
FIG. 3 schematically shows a plan view of a plane of a semiconductor device in a layer in which a semiconductor layer is formed in accordance with an embodiment of the present invention.
Figure 4:
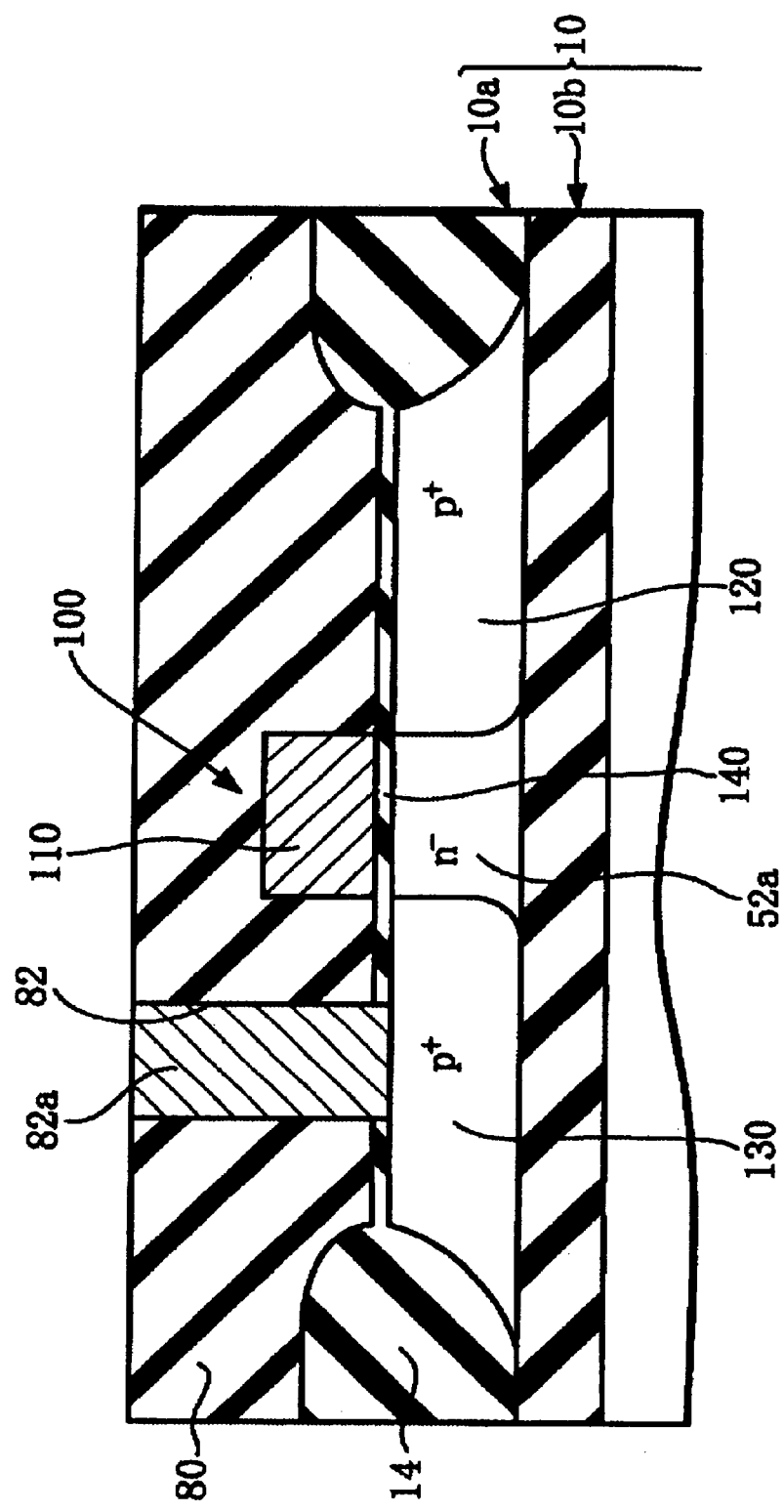
FIG. 4 schematically shows a cross-sectional view taken along a line A—A in FIG. 1.
Figure 5:
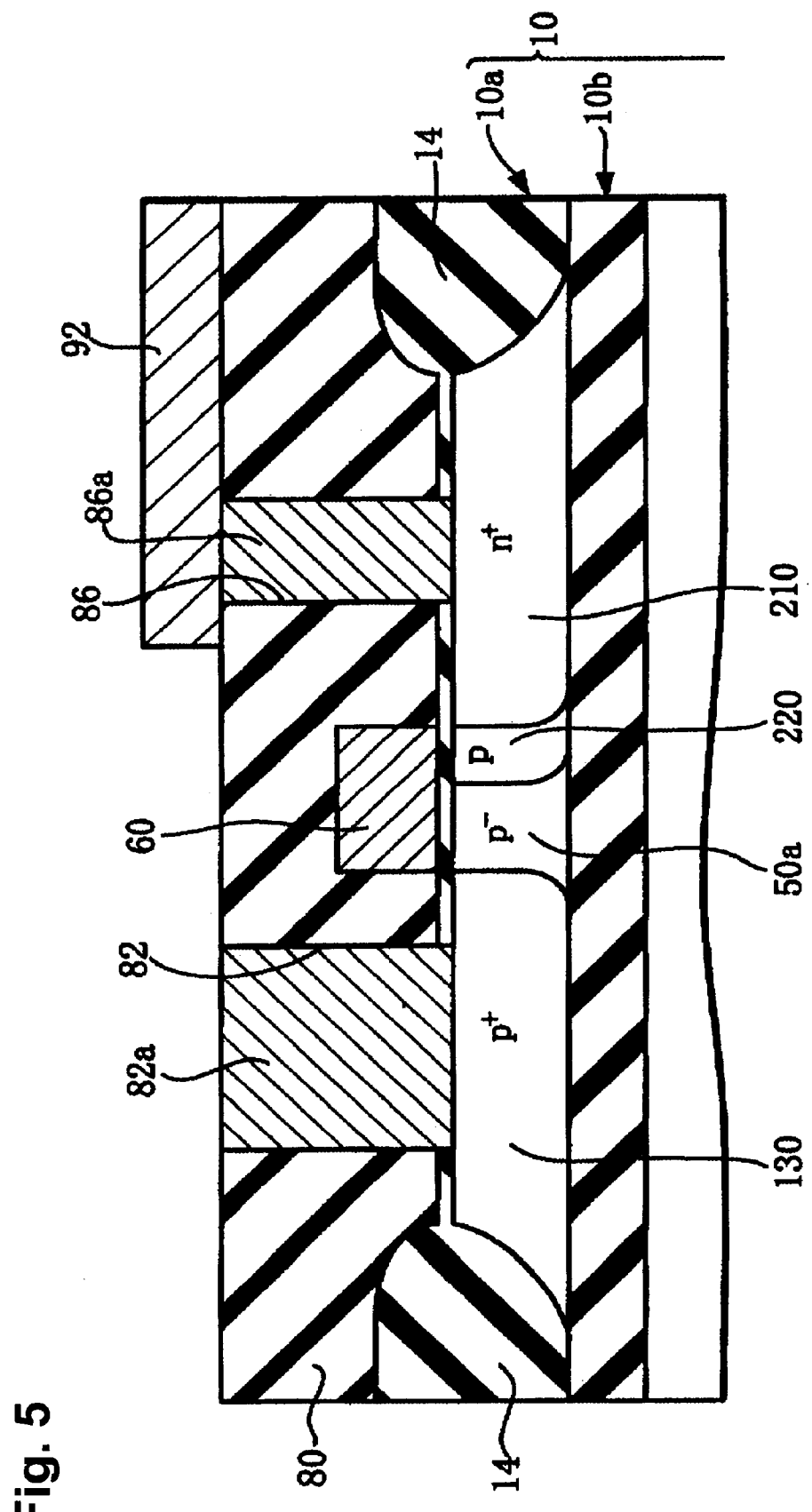
FIG. 5 schematically shows a cross-sectional view taken along a line B—B in FIG. 1.
Figure 6:
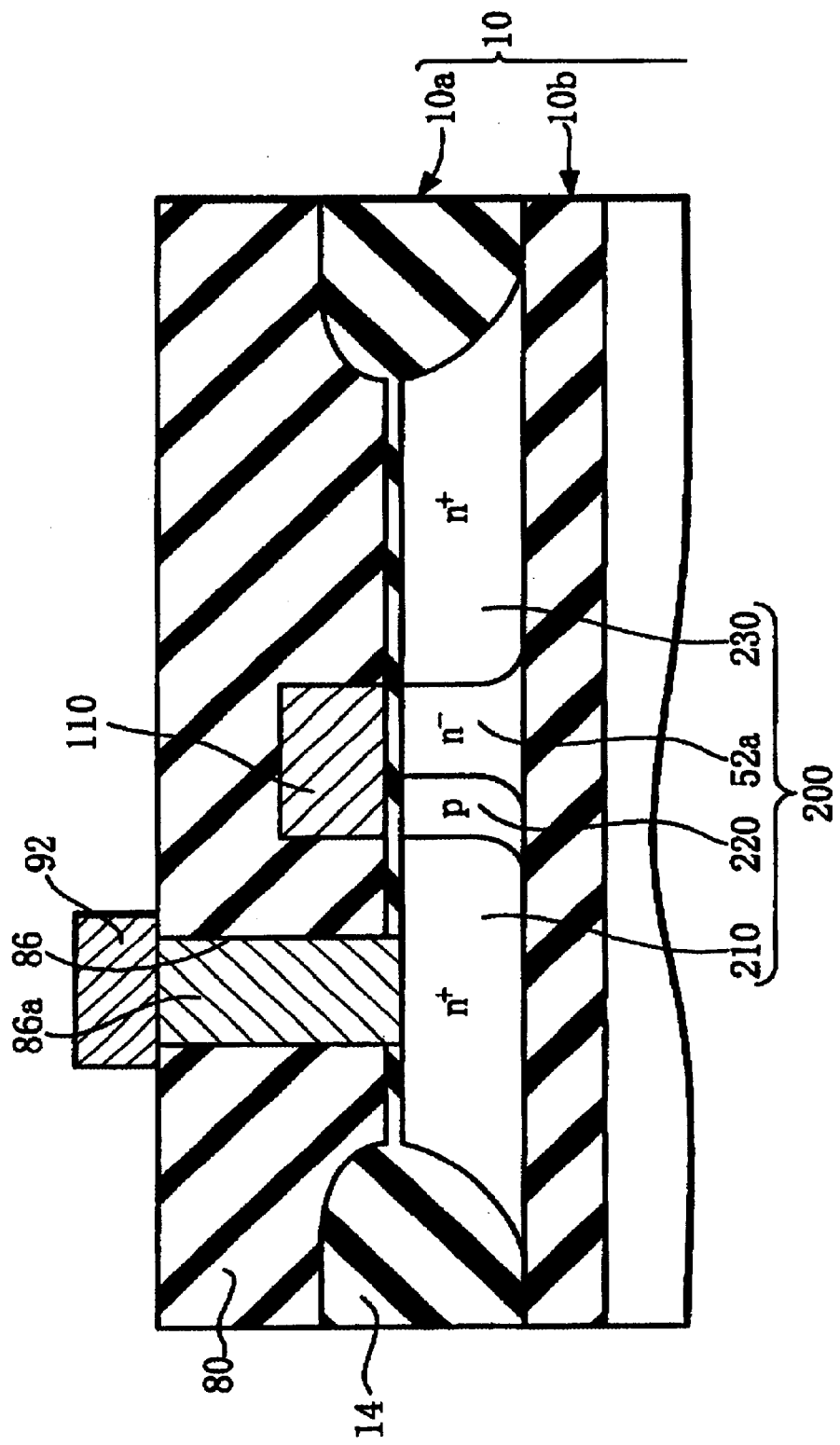
FIG. 6 schematically shows a cross-sectional view taken along a line C—C in FIG. 1.
Figure 7:
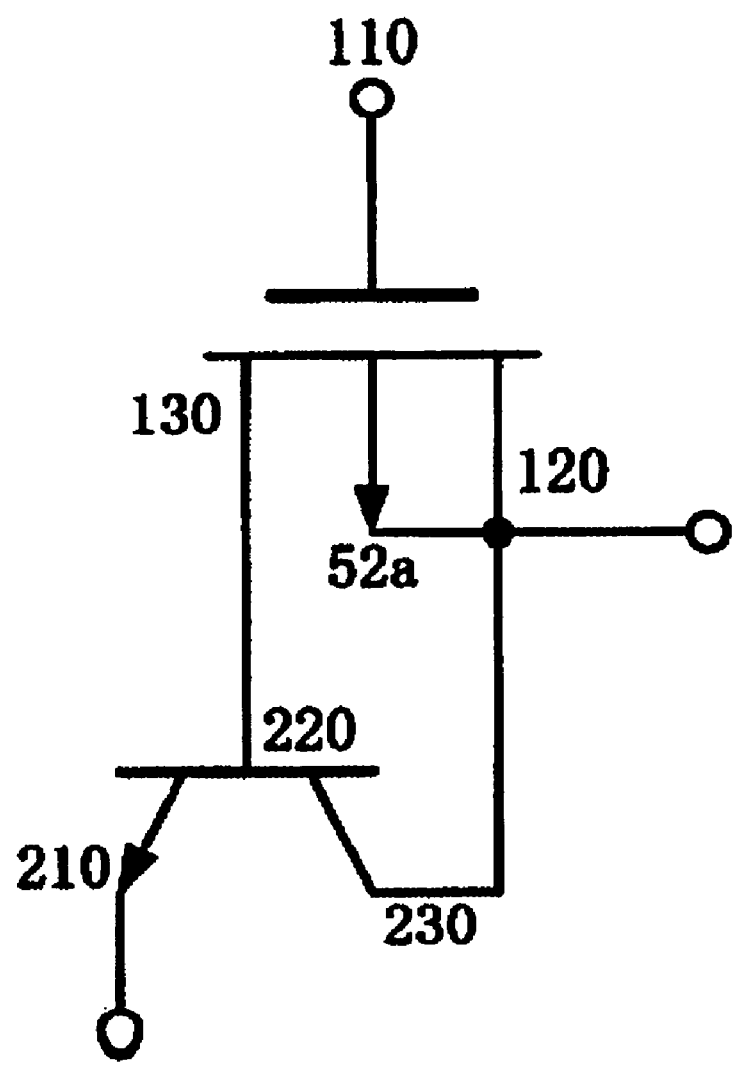
FIG. 7 shows an equivalent circuit of an embodiment of the present invention.

A semiconductor device in accordance with an illustrated embodiment of the present invention is described below. FIG. 1 schematically shows a plan view of a semiconductor device in accordance with the illustrated embodiment of the present invention. FIG. 2 schematically shows a plan view of a plane surface of the semiconductor device in a layer in which a gate electrode is formed and below that layer. FIG. 3 schematically shows a plan view of a plane of a semiconductor device in a layer in which a semiconductor layer is formed, more specifically, it shows a composition of an impurity diffusion layer and a body region. In FIG. 3, regions with fine hatched lines extending downwardly to the right indicate n-type regions, and regions with fine hatched lines extending downwardly to the left indicate p-type regions. FIG. 4 schematically shows a cross-sectional view taken along a line A—A in FIG. 1. More specifically, FIG. 4 schematically shows a cross-sectional view of a field effect transistor. FIG. 5 schematically shows a cross-sectional view taken along a line B—B in FIG. 1. FIG. 6 schematically shows a cross-sectional view taken along a line C—C in FIG. 1. More specifically, FIG. 6 schematically shows a cross-sectional view of a bi-polar transistor. FIG. 7 shows an equivalent circuit of the present embodiment. In FIG. 1 through FIG. 3, regions with thick hatched lines indicate element isolation regions.

A semiconductor device 1000 includes an SOI substrate 10, as shown in FIG. 1 and FIGS. 4 through 6. The SOI substrate 10 includes a semiconductor layer 10a formed on an insulation layer 10b. In the semiconductor layer 10a, a field effect transistor (MOS transistor) 100 and a bi-polar transistor 200 are formed.

Element isolation regions 14 are formed in predetermined regions of the semiconductor layer 10a. An element forming region 16 is defined by the element isolation regions 14. The field effect transistor 100 and the bi-polar transistor 200 are formed in the same element forming region 16. The field effect transistor 100 is p-type and the bi-polar transistor 200 is npn-type.

The field effect transistor 100 has a gate electrode layer 110, a p-type source region 120 and a p-type drain region 130, as shown in FIG. 4. As shown in FIG. 6, the bi-polar transistor 200 has an n-type emitter region 210, a p-type base region 220, an n-type body region 52a, and an n-type collector region 230. Compositions of the field effect transistor 100 and the bi-polar transistor 200 are described more specifically below.

First, referring to FIG. 2, a layer in which a gate electrode layer 110 is formed is described. The gate electrode layer 110 is formed over a predetermined region of the element forming region 16 through a gate dielectric layer 140 (shown in FIG. 4). More specifically, the gate electrode layer 110 is formed to cross over the element forming region 16. Specifically, the gate electrode layer 110 extends from the element isolation region 14, passing over the element forming region 16, again to the element isolation region 14. A first electrode layer 60 is formed at a side section of the gate electrode layer 110. The first electrode layer 60 is connected to the gate electrode layer 110. The first electrode layer 60 is formed over a specified region of the element forming region 16, and extends to the element isolation region 14. The first electrode layer 60 and the gate electrode layer 110 are formed in one piece.

Next, referring to FIG. 2 and FIG. 3, a layer in which the semiconductor layer 10a is formed is described. Among a region that is surrounded by the gate electrode layer 110, the first electrode layer 60 and the element isolation region 14, a region on the side where the field effect transistor 100 is formed is defined as a first region A10, and a region on the side where the bi-polar transistor 200 is formed is defined as a third region A30. A p-type drain region 130 is formed in the semiconductor layer 10a in the first region A10. The p-type drain region 130 is formed from a p-type impurity diffusion layer.

A region that is surrounded by the gate electrode layer 110 and the element isolation region 14 is defined as a second region A20. A p-type source region 120 is formed in a part of the semiconductor layer 10a in the second region A20. The p-type source region 120 is formed from a p-type impurity diffusion layer. Also, an n-type collector region 230 is formed in a part of semiconductor layer in the second region A20. The n-type collector region 230 is formed from an n-type impurity diffusion layer.

An n-type emitter region 210 is formed in the third region A30. The n-type emitter region 210 is formed from an n-type impurity diffusion layer.

In the element forming region 16, a p-type base region 220 is formed below the gate electrode layer 110 and the first electrode layer 60 that are adjacent to the third region A30. The p-type base region 220 is formed from a p-type impurity diffusion layer. The p-type base region 220 is formed along a periphery of the n-type emitter region 210.

In the element forming region 16, an n-type body region 52a is formed in the semiconductor layer 10a below the gate electrode layer 110. The n-type body region 52a is electrically connected to the n-type collector region 230.

A first p-type body region 50a is formed in the semiconductor layer 10a below the first electrode layer 60. The first p-type body region 50a is formed between the p-type drain region 130 and the p-type body region 220. The first p-type body region 50a electrically connects the p-type drain region 130 and the p-type body region 220.

In the element forming region 16, a second p-type body region 50b is formed in the semiconductor layer 10a below the gate electrode layer 110 in a region where the bi-polar transistor 200 is formed, and in the semiconductor layer 10a adjacent to the element isolation region 14.

Next, the portion above the semiconductor layer 10a is described with reference to FIG. 1 and FIGS. 4 through 6. An interlayer dielectric layer 80 is formed on the semiconductor layer 10a. First–fourth through holes 82, 84, 86 and 88 are formed in specified regions in the interlayer dielectric layer 80. The first through hole 82 is formed in the first region A10. The second through hole 84 is formed in the second region A20. The second through hole 84 is formed in a manner to cross over the p-type source region 120 and the n-type collector region 230. The third through hole 86 is formed in the third region A30. The fourth through hole 88 is formed to take out the gate electrode layer 110.

First–fourth contact layers 82a, 84a, 86a and 88a are formed in the first–fourth through holes 82, 84, 86 and 88, respectively. The second contact layer 82a has a function to electrically connect the p-type source region 120 and the n-type collector region 230.

A first wiring layer 90 that is electrically connected to the second contact layer 84a is formed on the interlayer dielectric layer 80. Also, a second wiring layer 92 that is electrically connected to the third contact layer 86a is formed on the interlayer dielectric layer 80. Also, a third wiring layer 94 that is electrically connected to the fourth contact layer 88a is formed on the interlayer dielectric layer 80.

A method for manufacturing a semiconductor device in accordance with one embodiment of the present invention is described below. FIGS. 8 through 13 schematically show steps for manufacturing a semiconductor device in accordance with one embodiment of the present invention. In FIGS. 9 through 13, regions with fine hatched lines extending downwardly to the left indicate p-type regions, and regions with fine hatched lines extending downwardly to the right indicate n-type regions.

Figure 8:
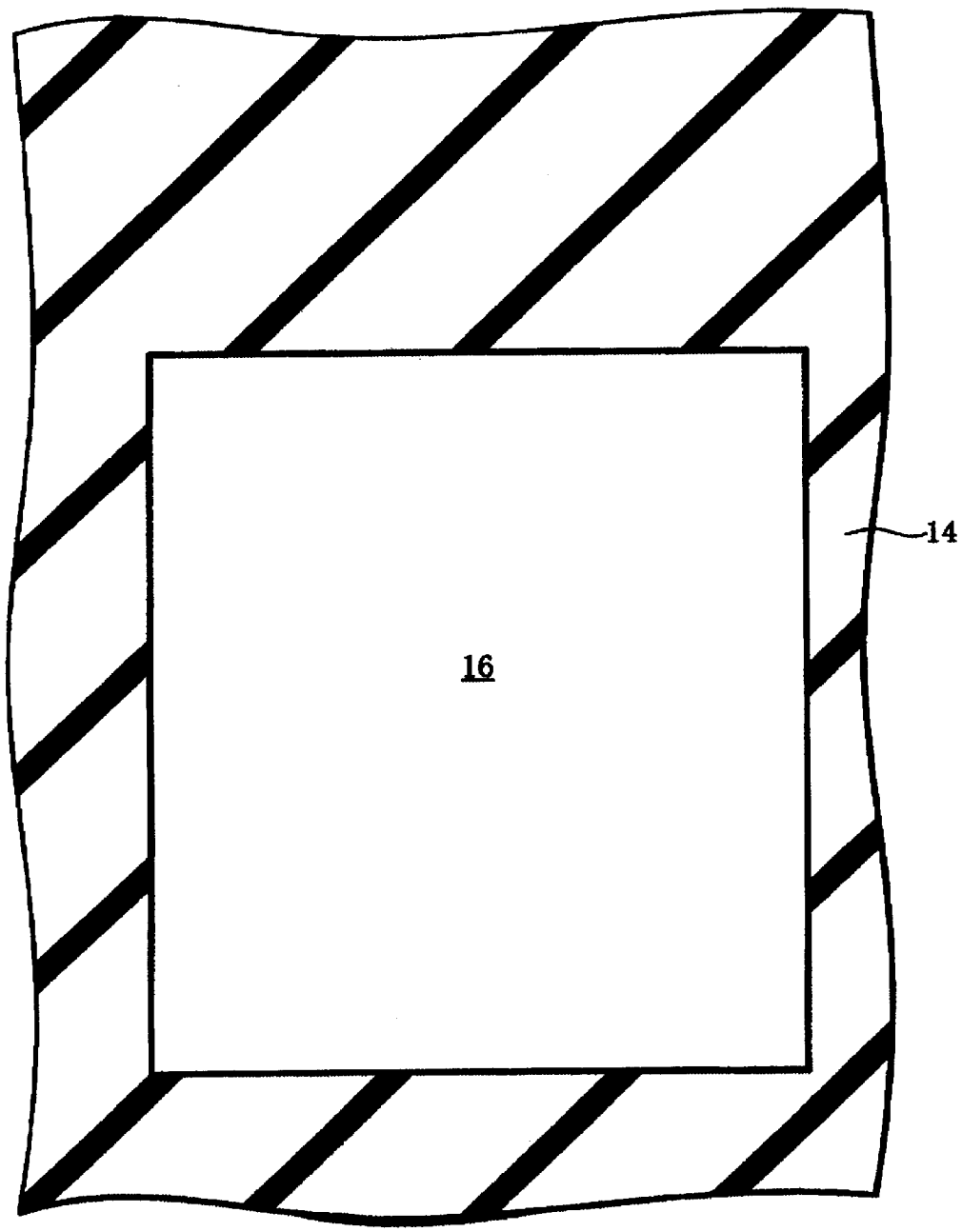
FIG. 8 schematically shows a cross-sectional view of a step of manufacturing a semiconductor device in accordance with an embodiment of the present invention.

First, as shown in FIG. 8, an element isolation region 14 is formed in a semiconductor layer 10a in a SOI substrate 10. By forming the element isolation region 14, an element forming region 16 is defined. A LOCOS method and a trench isolation method are examples of methods of forming the element isolation region 14.

Figure 9:
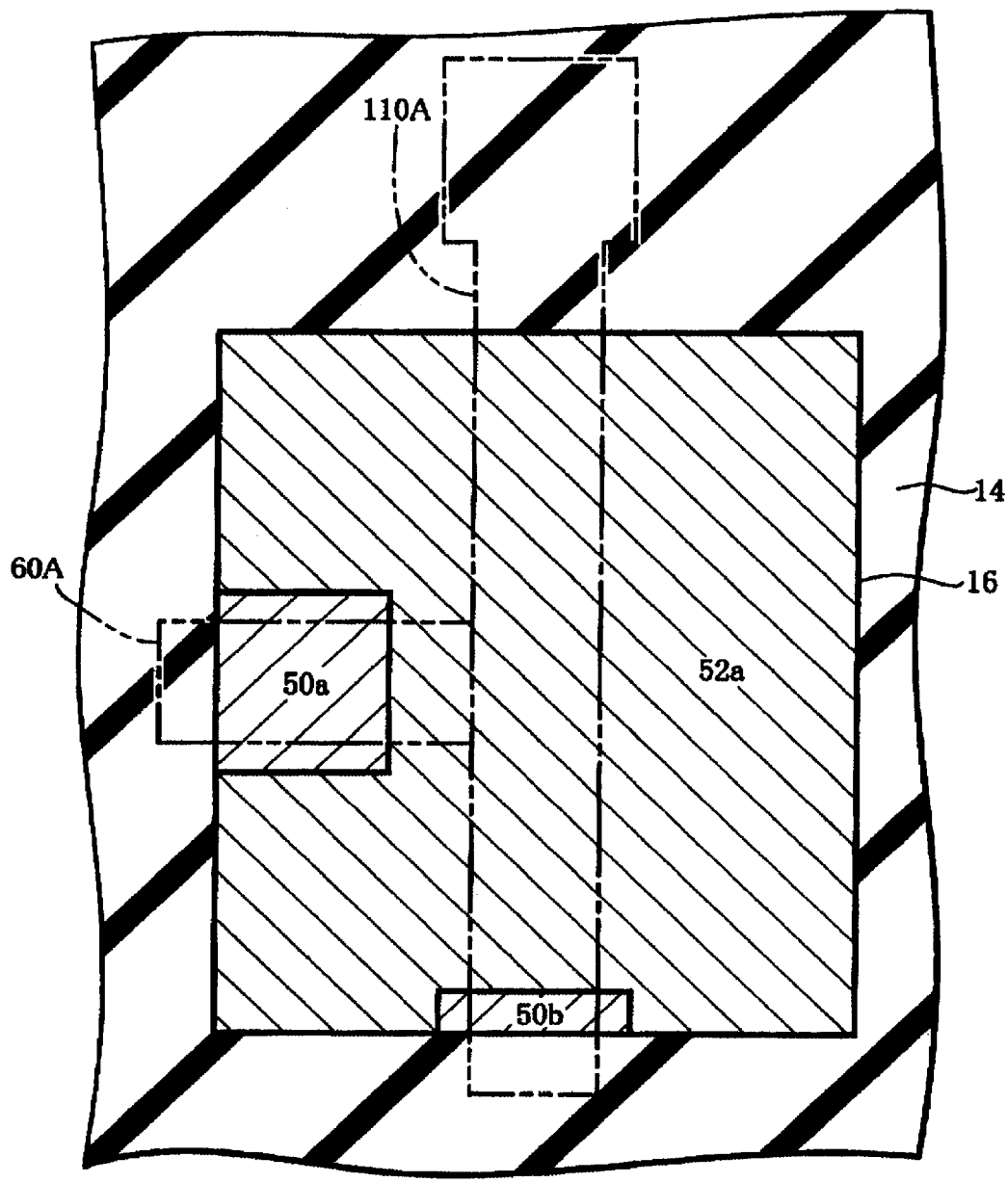
FIG. 9 schematically shows a cross-sectional view of a step of manufacturing the semiconductor device in accordance with an embodiment of the present invention.

Next, as shown in FIG. 9, an n-type body region 52a and a first p-type body region 50a are formed in the semiconductor layer 10a in the element forming region 16. The n-type body region 52a is formed at least in a region 110a where a gate electrode layer is to be formed. The first p-type body region 50a is formed in a region 60A where a first electrode layer is to be formed. When the element isolation region 14 is formed by a LOCOS method, a first p-type body region 50b may preferably be formed in the semiconductor layer 10a in a region 110A where the gate electrode layer is to be formed in the bi-polar transistor, and in the semiconductor layer 10a adjacent to the element isolation region 14.

The first and second p-type body regions 50a and 50b and the n-type body region 52a can be formed in the following manner, for example. Using a lithography technique, a p-type impurity is ion-implanted in specified regions to form the first and second p-type body regions 50a and 50b; and then, using a lithography technique, an n-type impurity is ion-implanted to form the n-type body region 52a. Also, in accordance with another method, a p-type impurity may be ion-implanted in the entire element forming region 16, and then a lithography technique may be used to ion-implant an n-type impurity in specified regions.

Figure 10:
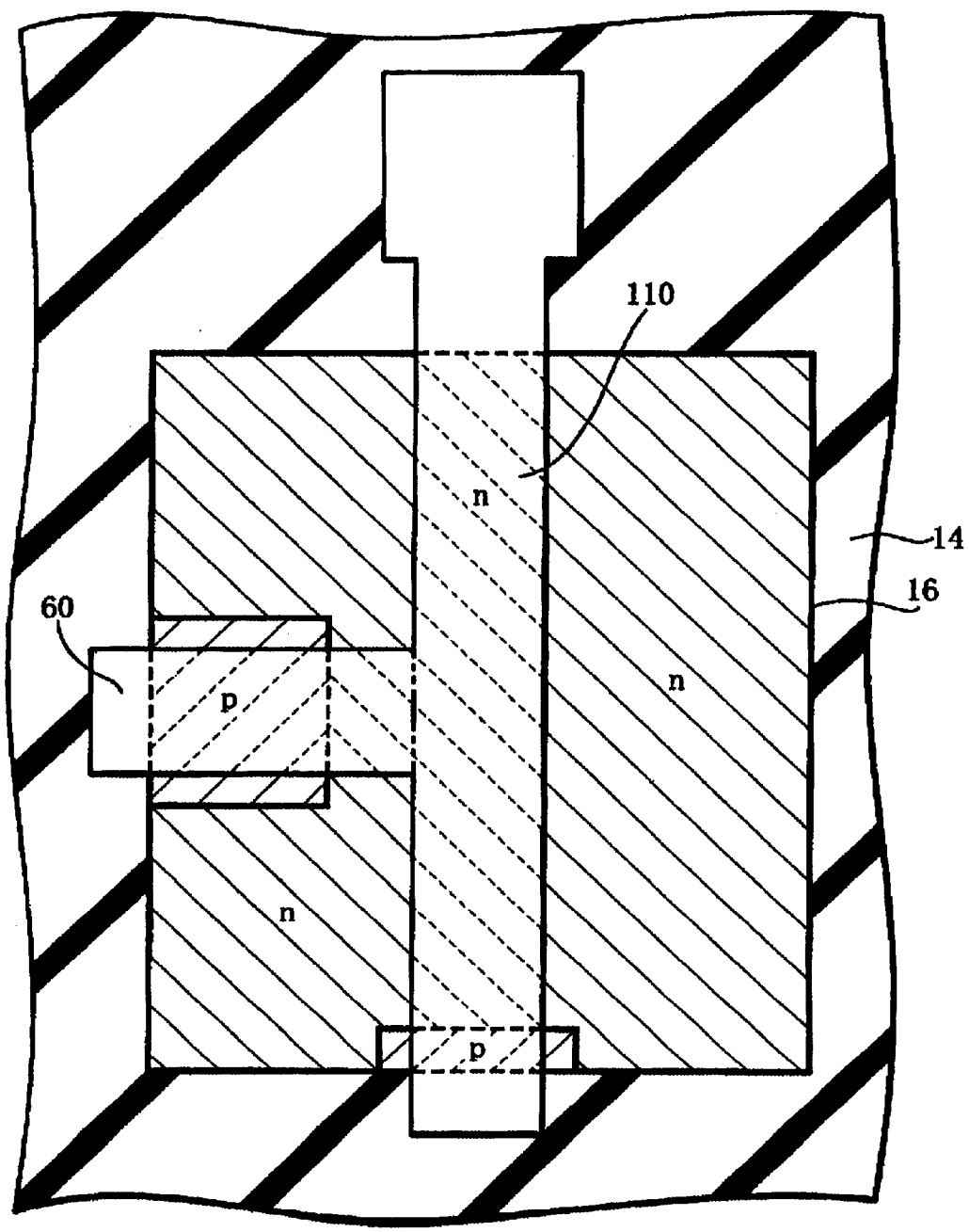
FIG. 10 schematically shows a cross-sectional view of a step of manufacturing the semiconductor device in accordance with an embodiment of the present invention.

Next, a CVD method or the like is used to deposit a polysilicon layer on the entire surface. Then, by conducting a lithography technique and an etching technique, the polysilicon layer is patterned, to thereby form a gate electrode layer 110 and a first electrode layer 60, as shown in FIG. 10.

Figure 11:
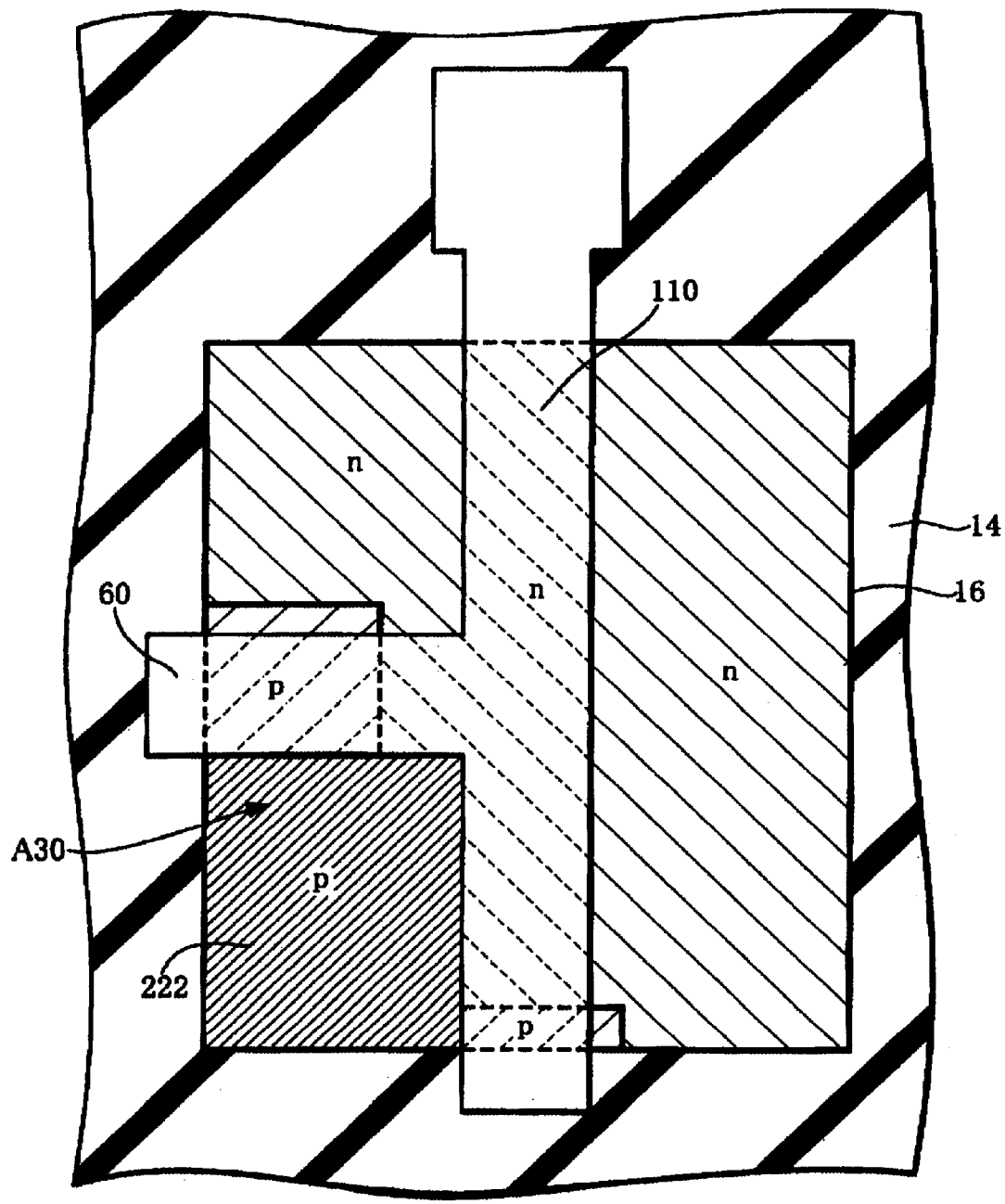
FIG. 11 schematically shows a cross-sectional view of a step of manufacturing the semiconductor device in accordance with an embodiment of the present invention.

Next, as shown in FIG. 11, by using a lithography technique, a p-type impurity is selectively ion-implanted in the third region A30, to thereby form a p-type impurity diffusion layer 222.

Figure 12:
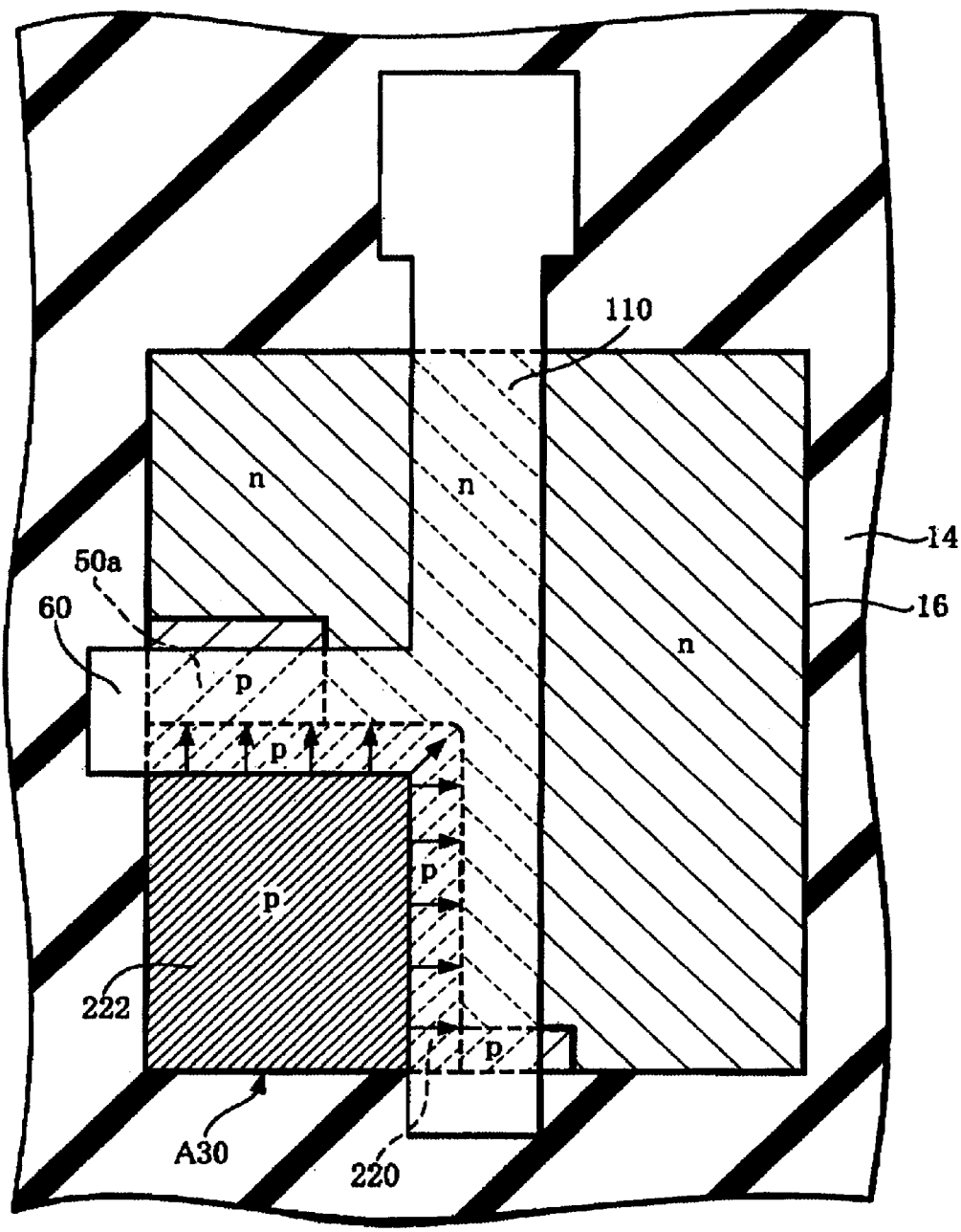
FIG. 12 schematically shows a cross-sectional view of a step of manufacturing the semiconductor device in accordance with an embodiment of the present invention.

Next, as shown in FIG. 12, the substrate 10 is thermally treated to thermally diffuse the p-type impurity diffusion layer 222. As a result, a p-type base region 220 is formed below a part of the first electrode layer 60 and below the gate electrode layer 110 in a region where a bi-polar transistor is to be formed. More specifically, when the thermal treatment temperature is 1100° C., the thermal treatment time is, for example, ten minutes. When the thermal treatment temperature is 1050° C., the thermal treatment time is, for example, thirty minutes.

Figure 13:
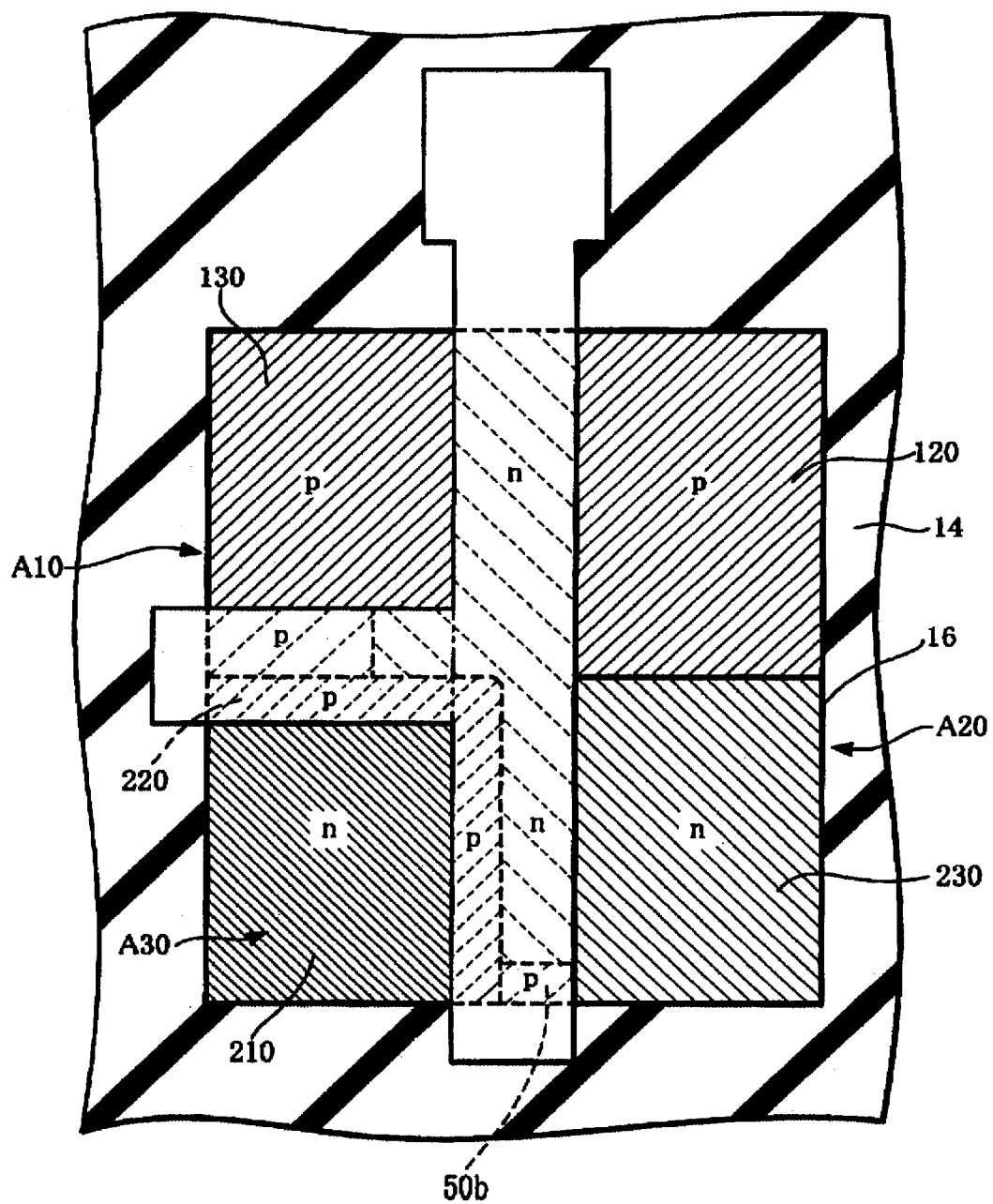
FIG. 13 schematically shows a cross-sectional view of a step of manufacturing the semiconductor device in accordance with an embodiment of the present invention.
Figure 14:
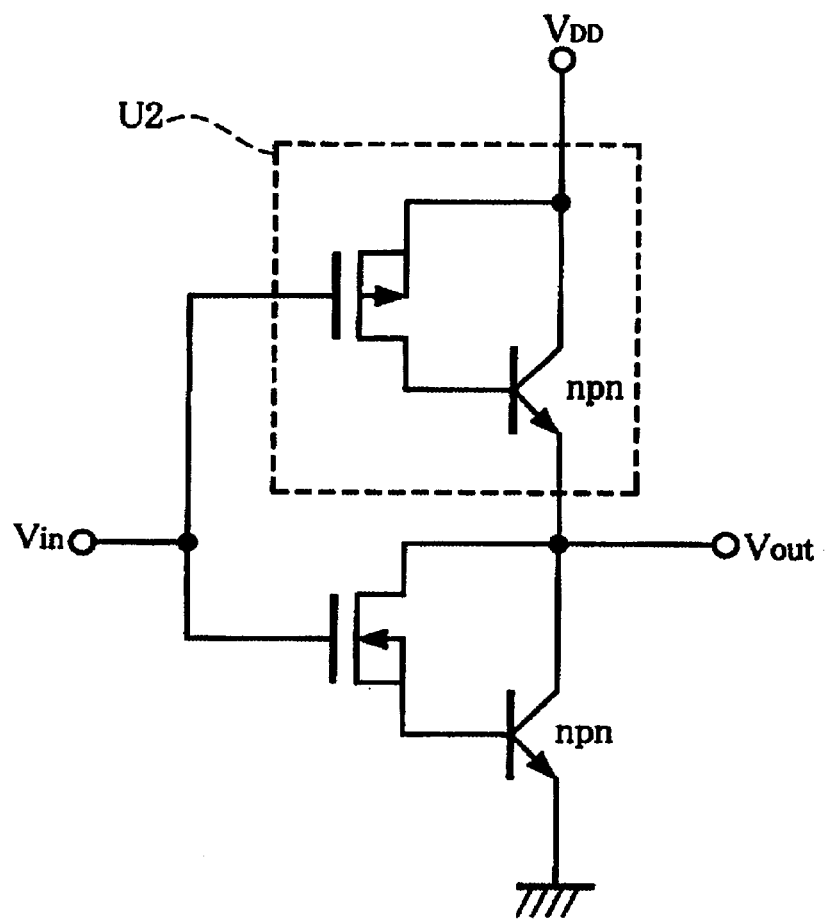
FIG. 14 shows an equivalent circuit of an inverter circuit of a BICMOS in accordance with an embodiment of the present invention.

Next, as shown in FIG. 13, by using a lithography technique, a p-type impurity is selectively ion-implanted in specified regions in the element forming region 16. By doing this, a p-type drain region 130 is formed in the first region A10, and a p-type source region 120 is formed in the second region A20.

Next, by using a lithography technique, an n-type impurity is selectively ion-implanted in specified regions in the element forming region 16. By doing so, an n-type collector region 230 is formed in the second region A20, and an n-type emitter region 210 is formed in the third region A30.

Next, as shown in FIG. 1 and FIGS. 4 through 6, an interlayer dielectric layer 80 that is formed from silicon oxide is formed on the SOI substrate 10 by a known method. Next, first–fourth through holes 82, 84, 86 and 88 are formed in specified regions in the interlayer dielectric layer 80. Then, conduction layers are filled in the first–fourth through holes 82, 84, 86 and 88, to thereby form first–fourth contact layers 82a, 84a, 86a and 88a. Next, first–third wiring layers 90, 92 and 94 having specified patterns are formed on the interlayer dielectric layer 80. In this manner, the semiconductor device 1000 in accordance with the present embodiment is manufactured.

Effects which may be present in the method for manufacturing a semiconductor device in accordance with the present embodiment are described below.

(1) In accordance with the present embodiment, the p-type impurity diffusion layer 222 is formed in the third region A30, and the p-type impurity diffusion layer 222 is thermally treated to thereby thermally diffuse the p-type impurity to form the p-type base region 220. As a result, the p-type base region 220 is electrically connected to the p-type drain region 130 through the first p-type body region 50a. Accordingly, by the manufacturing method in accordance with the present embodiment, the p-type base region 220 can be electrically connected to the p-type drain region 130 without forming a contact layer for leading out the p-type base region 220.

Also, in the present embodiment, by using the gate electrode layer 110 and the first electrode layer 60 as a mask, an n-type impurity may be ion-implanted in the third region A30 to form the n-type emitter region 210. Accordingly, in accordance with the present embodiment, the n-type emitter region 210 can be formed in a self-alignment manner with respect to the p-type base region 220.

(2) When the element isolation region 14 is formed by a LOCOS method, a second p-type body region 50b may preferably be formed in the semiconductor layer 10a below the gate electrode layer 110 in the region where the bi-polar transistor is formed, and in the semiconductor layer 10a adjacent to the element isolation region 14. The reason for this is described below.

Figure 15:
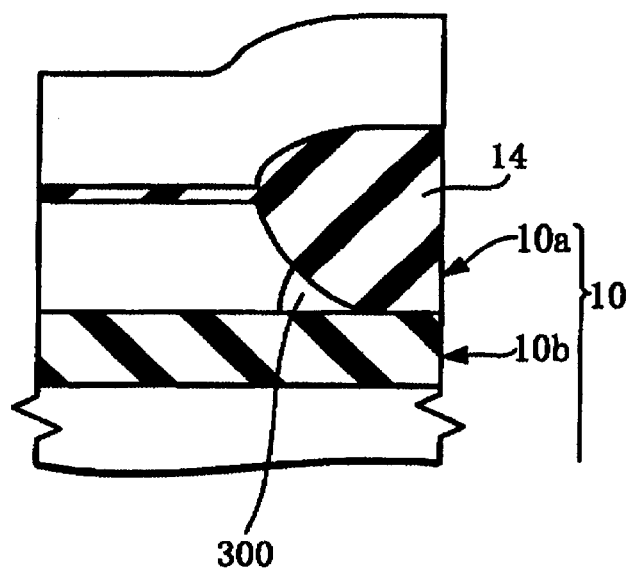
FIG. 15 schematically shows a cross-sectional view to describe effects in relation to an embodiment of the present invention.
Figure 16:
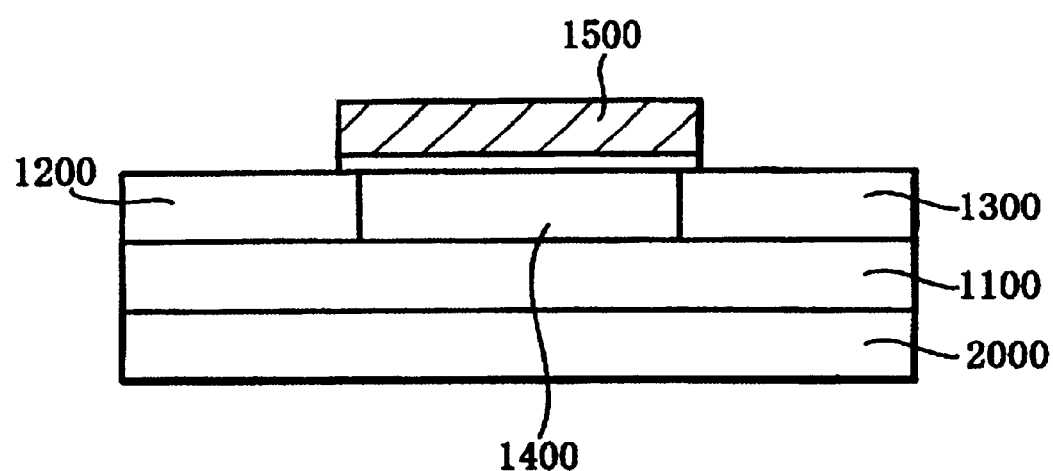
FIG. 16 schematically shows a MOS transistor formed on a SOI substrate in a conventional example.

When an n-type body region is formed in the semiconductor layer 10a below the gate electrode layer 110 in the region wherein the bi-polar transistor is formed, and in the semiconductor layer 10a adjacent to the element isolation region 14, the following inconveniences occur. The p-type base region 220 is formed by thermally diffusing the p-type impurity diffusion layer 222 in the third region A30. However, as shown in FIG. 15, the p-type impurity is difficult to thermally diffuse into a corner section that is defined by the element isolation region 14 and the insulation layer 10b, and the n-type body region 300 may remain in the corner section. If the n-type body region 300 remains, the n-type emitter region 210 and the n-type collector region 230 are short-circuited through the n-type body region 300.

Accordingly, the second p-type body region 50b may be formed in the semiconductor layer 10a below the gate electrode layer 110 in the region where the bi-polar transistor is formed, and in the semiconductor layer 10a adjacent to the element isolation region 14. As a result, the n-type emitter region 210 and the n-type collector region 230 are securely prevented from being short-circuited.

MODIFIED EXAMPLES

A variety of modifications can be made in accordance with embodiments of the present invention within the scope of the present invention.

(1) In the embodiment described above, the field effect transistor is p-type, and the bi-polar transistor is npn-type.

However, the field effect transistor may be n-type, and the bi-polar transistor may be pnp-type.

Figure 17:
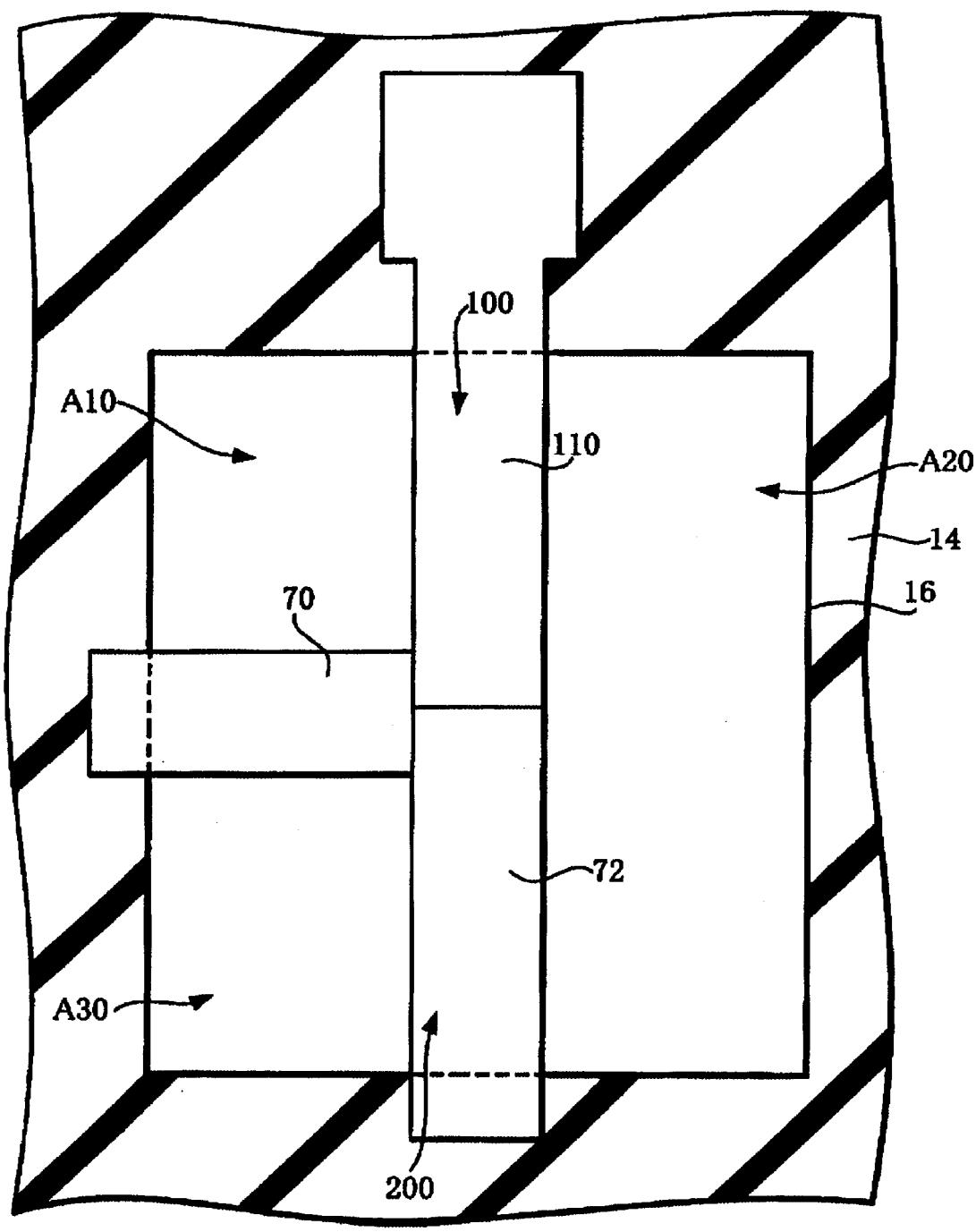
FIG. 17 schematically shows a plan view of a modified example of a semiconductor device in a layer in which the gate electrode layer is formed in accordance with an embodiment of the present invention.

(2) In the embodiment described above, the gate electrode layer 110 is provided in a manner to cross over the element forming region 16. Also, the first electrode layer 60 is formed extending from the side section of the gate electrode layer 110 and reaching the element isolation region 16. However, without being limited to this, the first region A10, the second region A20 and the third region A30 can be formed by the gate electrode layer 110, the first layer 70 and the second layer 72, as shown in FIG. 17. The material for the first layer 70 and the second layer 72 are not particularly limited, and for example, a variety of dielectric materials (for example, silicon oxide, silicon nitride) may be used therefor.

In the modified example (2) described above, the gate electrode layer 110, the first layer 70 and the second layer 72 may be connected, for example, in the following relations. a) An end section of the first layer 70 continues to the gate electrode layer 110, and an end section of the second layer 72 also continues to the gate electrode layer 110. b) An end section of the first layer 70 continues to the gate electrode layer 110, and an end section of the second layer 72 continues to an end section of the first layer 70. c) An end section of the second layer 72 continues to the gate electrode layer 110, and an end section of the first layer 70 continues to an end section of the second layer 72.

The present invention is not limited to the embodiments described above, and many modifications can be made without departing the scope of the subject matter of the present invention.

What is claimed:

1. A semiconductor device comprising:

an insulation layer;

a semiconductor layer formed on the insulation layer;

an element isolation region formed in the semiconductor layer;

element forming regions defined by the element isolation region;

a bi-polar transistor and a field effect transistor in at least one of the element forming regions;

wherein the bi-polar transistor includes an emitter region of a first conduction type, a base region of a second conduction type, and a collector region of the first conduction type, wherein the field effect transistor includes a gate electrode layer, a source region of the second conduction type, and a drain region of the second conduction type, wherein the field effect transistor further includes a first conduction type body region formed at least between the source region and the drain region, wherein the first conduction type body region is electrically connected to the collector region, the source region is electrically connected to the collector region, and the drain region is electrically connected to the base region, a first electrode layer having one end section that continues to a side section of the gate electrode layer and another end section that reaches the element isolation region, wherein the gate electrode layer is formed in a manner to cross over the element forming region, the drain region is formed in a first region surrounded by the gate electrode layer in the field effect transistor forming region, the first electrode layer, and the element isolation region, the source region and the collector region are formed in a second region surrounded by the gate electrode layer and the element isolation region, the emitter region is formed in a third region surrounded by the gate electrode layer in the bi-polar transistor forming region, the first electrode layer and the element isolation region, and the first conduction type body region is formed below the gate electrode layer.

2. A semiconductor device comprising:

an insulation layer;

a semiconductor layer formed on the insulation layer;

an element isolation region formed in the semiconductor layer;

element forming regions defined by the element isolation region;

a bi-polar transistor and a field effect transistor in at least one of the element forming regions;

wherein the bi-polar transistor includes an emitter region of a first conduction type, a base region of a second conduction type, and a collector region of the first conduction type, wherein the field effect transistor includes a gate electrode layer, a source region of the second conduction type, and a drain region of the second conduction type, wherein the field effect transistor further includes a first conduction type body region formed at least between the source region and the drain region;

wherein the first conduction type body region is electrically connected to the collector region, the source region is electrically connected to the collector region, and the drain region is electrically connected to the base region;

a first layer and a second layer, wherein the first layer has one end section continuing to the gate electrode layer or the second layer, and another end section reaching the element isolation region, the second layer has one end section continuing to the sate electrode layer or the first layer, and another end section reaching the element isolation region, the drain region is formed in a first region surrounded by the gate electrode layer, the first layer and the element isolation region, the source region is formed in a second region surrounded by the gate electrode layer, the second layer and the element isolation region, the collector region is formed in a part of the semiconductor layer in the second region, the emitter region is formed in a third region surrounded by the first layer, the second layer and the element isolation region, the base region is formed below a part of the first layer, and in the semiconductor layer below a part of the second layer, the first conduction type body region is formed in the semiconductor layer at least below the gate electrode layer and below a part of the second layer, and a connection section is formed for electrically connecting the base region and the drain region in the semiconductor layer below a part of the first layer.

3. A semiconductor device according to claim 2, wherein the connection section is a first body region of the second conduction type.

4. A semiconductor device comprising:

an insulation layer;

a semiconductor layer formed on the insulation layer;

an element isolation region formed in the semiconductor layer;

element forming regions defined by the element isolation region;

a bi-polar transistor and a field effect transistor in at least one of the element forming regions;

wherein the bi-polar transistor includes an emitter region of a first conduction type, a base region of a second conduction type, and a collector region of the first conduction type, wherein the field effect transistor includes a gate electrode layer, a source region of the second conduction type, and a drain region of the second conduction type, wherein the field effect transistor further includes a first conduction type body region formed at least between the source region and the drain region;

wherein the first conduction type body region is electrically connected to the collector region, the source region is electrically connected to the collector region, and the drain region is electrically connected to the base region; and wherein a contact layer is formed for electrically connecting the source region and the collector region, and the contact layer is formed in a manner to cross over the source region and the collector region.

5. A semiconductor device comprising:

an insulation layer;
 a semiconductor layer formed on the insulation layer;
 an element isolation region formed in the semiconductor layer;
 element forming regions defined by the element isolation region;
 a bi-polar transistor and a field effect transistor in at least one of the element forming regions;
 wherein the bi-polar transistor includes an emitter region of a first conduction type, a base region of a second conduction type, and a collector region of the first conduction type,
 wherein the field effect transistor includes a gate electrode layer, a source region of the second conduction type, and a drain region of the second conduction type,
 wherein the field effect transistor further includes a first conduction type body region formed at least between the source region and the drain region;
 wherein the first conduction type body region is electrically connected to the collector region, the source region is electrically connected to the collector region, and the drain region is electrically connected to the base region: and
 wherein a second body region of the second conduction type is formed in the semiconductor layer between the collector region and the emitter region, and in the semiconductor layer adjacent to the element isolation region.

6. A semiconductor device according to claim 5, wherein the first conduction type is n-type, and the second conduction type is p-type.

7. A semiconductor device according to claim 5, wherein the first conduction type is p-type, and the second conduction type is n-type.

8. A semiconductor device according to claim 5, wherein the semiconductor layer is a silicon layer.

9. A semiconductor device comprising:

an insulation layer;

a semiconductor layer formed on the insulation layer;

an element isolation region formed in the semiconductor layer;

element forming regions defined by the element isolation region; and a bi-polar transistor and a field effect transistor in at least one of the element forming regions;

wherein a gate electrode layer is formed on the semiconductor layer, the gate electrode layer is formed in a manner to cross over the element forming region, a first electrode layer is formed on the semiconductor layer, wherein the first electrode layer has one end section continuing to a side section of the gate electrode layer, and another end section reaching the element isolation region, a first impurity diffusion layer of the second conduction type is formed in a first region surrounded by the gate electrode layer in the field effect transistor forming region, the first electrode layer and the element isolation region, a second impurity diffusion layer of the second conduction type is formed in the field effect transistor forming region among a second region surrounded by the gate electrode layer and the element isolation region, a first impurity diffusion layer of the first conduction type is formed in the second region in the bi-polar transistor forming region, a second impurity diffusion layer of the first conduction type is formed in a third region surrounded by the gate electrode layer in the bi-polar transistor forming region, the first electrode layer and the element isolation region, a first conduction type body region is formed below the gate electrode layer, a third impurity diffusion layer of the second conduction type is formed below the gate electrode layer in the bi-polar transistor forming region and the first electrode layer and along a periphery of the second impurity diffusion layer of the first conduction type, the first conduction type body region is electrically connected to the first impurity diffusion layer of the first conduction type, the second impurity diffusion layer of the second conduction type is electrically connected to the first impurity diffusion layer of the first conduction type, and the first impurity diffusion layer of the second conduction type is electrically connected to the third impurity diffusion layer of the second conduction type.

* * * * *